United States Patent [19]

Belasco et al.

[11] 4,059,764
[45] Nov. 22, 1977

[54] MULTI-ELEMENT INFRA RED SENSORS

[75] Inventors: Melvin Belasco, Dallas; Billie Joe Cottongim, Richardson, both of Tex.

[73] Assignee: Texas Instruments Incorporated, Dallas, Tex.

[21] Appl. No.: 752,196

[22] Filed: Aug. 13, 1968

[51] Int. Cl.² .............................................. G01J 1/00
[52] U.S. Cl. .................................... 250/352; 250/338
[58] Field of Search .................. 338/18; 250/338, 352; 357/30

[56] References Cited

U.S. PATENT DOCUMENTS

| | | | |
|---|---|---|---|
| 3,080,542 | 3/1963 | Long | 338/18 |
| 3,180,989 | 4/1965 | Hand et al. | 250/83.3 |
| 3,210,548 | 10/1965 | Morrison | 317/235 |
| 3,259,865 | 7/1966 | Lederhandler et al. | 250/83.3 |
| 3,426,198 | 2/1969 | Autrey | 250/83.3 |

Primary Examiner—S. C. Buczinski
Attorney, Agent, or Firm—James T. Comfort; Gary C. Honeycutt

[57] ABSTRACT

A miniaturized multi-element infra-red sensor comprises a Dewar tube having a tubular core and a jacket with an infra-red transmitting window at the upper end of the jacket. A multi-element infra-red sensing array is mounted on a printed circuit member at the upper end of the core. Wires are interconnected between the infra-red sensing elements of the array and leads printed on the printed circuit member which radiate out to the margin of the latter. Conductors extending longitudinally of the core have their upper ends bent around the edge of the printed circuit member and attached to the outer ends of the printed leads. In the manufacture of the device, the conductors are initially formed as part of a lead frame, which is assembled with the printed circuit member, prior to mounting of the array on the printed circuit member.

11 Claims, 14 Drawing Figures

FIGURE 12
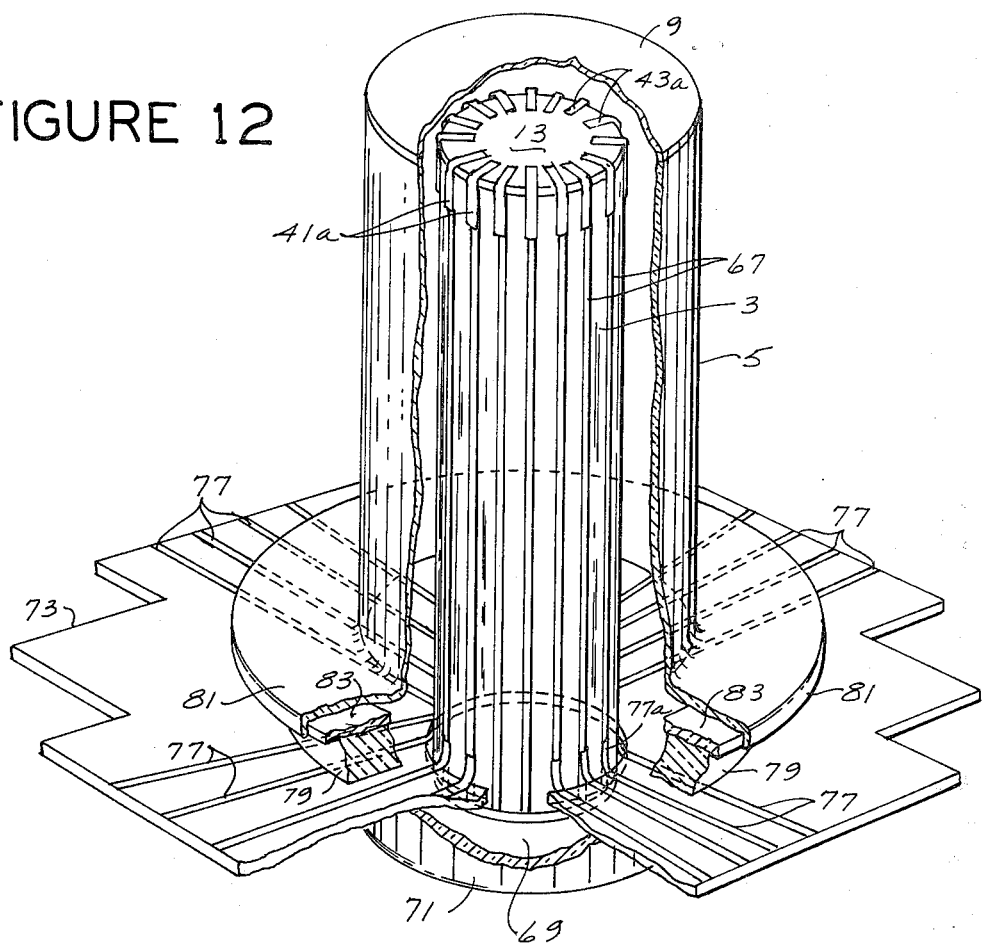
FIGURE 14
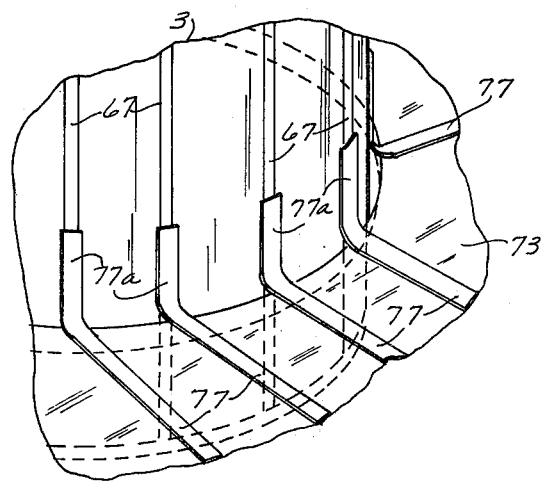
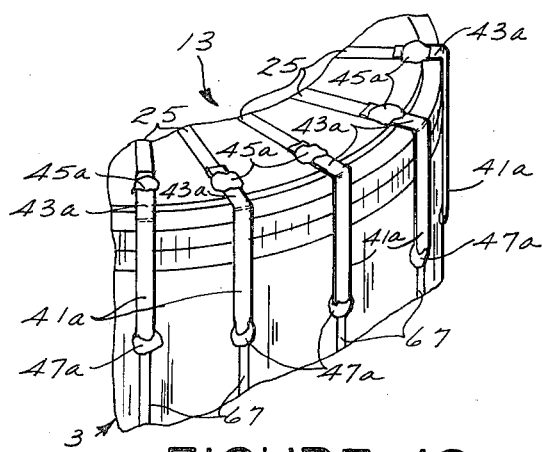
FIGURE 13

MULTI-ELEMENT INFRA RED SENSORS

This invention relates to multi-element infra-red sensors, and more particularly to micro-miniaturized multi-element infra-red sensors in which a multiplicity of infra-red sensing elements are provided in a vacuum receptacle such as a Dewar tube.

The invention is particularly concerned with the provision of micro-miniaturized sensors of the class described in which a relatively large number of infra-red sensing elements, more than twenty-five for example, are mounted on the inner end of the core of a vacuum receptacle such as a Dewar tube, for exposure to infra-red radiation transmitted through an infra-red transmitting window at the corresponding end of the jacket of the receptacle, as distinguished from prior sensors of this class in which only one or at most a few infra-red sensing elements are incorporated.

In a typical micro-miniaturized sensor of this invention, the vacuum receptacle may be constituted by a Dewar tube in which the core is about three inches long and has an outside diameter of only 0.64–0.80 inch. One of the problems attendant upon production of such a small sensor with a multiplicity of sensing elements is that of providing electrical leads from the sensing elements extending along the core to the outside of the receptacle at a reasonable cost and within the reasonable capability of production personnel and equipment. Considering, for example, the case of a sensor having fifty-two sensing elements (as is to be hereinafter described), the difficulty of providing the requisite multiplicity of leads (fifty-two plus a common lead) around the core (i.e., around a circumference of about 2.00–2.50 inches) is apparent. The difficulty is increased with increase in the number of sensing elements and hence in the number of leads.

Among the several objects of this invention may be noted the provision of constructions for and methods of making a multi-element infra-red sensing device of the class described which make possible the incorporation in a small vacuum receptable of a large number (e.g., more than 25 and up to 100 or more) infra-red sensing elements and leads therefor within the reasonable capability of production personnel and equipment and at reasonable cost; the provision of such constructions and methods which enable use of relatively simple and readily effected operations for attachment of the multiplicity of leads; and the provision of such constructions and methods which enable pre-testing of a sub-assembly including the sensing elements and leads before mounting in the vacuum receptacle.

In general, a multi-element infra-red sensor made in accordance with this invention comprises a vacuum receptacle having a tubular core open at one end and closed at the other and a jacket surrounding the core with a space therebetween. This space is evacuated. The jacket extends beyond the closed end of the core and has an infra-red transmitting window at its end beyond the closed end of the core. A printed circuit member is mounted on the closed end of the core, and an array of infra-red sensing elements is mounted on this printed circuit member facing the window. Means is provided for interconnecting each sensing element in an electrical circuit with terminals on the outside of the receptacle comprising a pattern of printed leads on the printed circuit member radiating out toward the margin of said member from the array with their outer ends spaced at intervals around said margin and leads extending longitudinally of the core interconnected with the outer ends of said radiating printed leads. In the manufacture of the sensor, a sub-assembly is made of the printed circuit member and a lead frame, the latter comprising a rim having a plurality of conductors radiating inward therefrom. The inner ends of these conductors are positioned over the outer ends of the radiating printed leads and attached thereto. The rim of the lead frame is removed and the array of infra-red sensing elements is mounted on the printed circuit member. The elements are interconnected with the radiating printed leads. The resultant sub-assembly is mounted on the closed end of the core of the receptacle, and the conductors are bent around the edge of the printed circuit member to extend longitudinally of the core. Other objects and features will be in part apparent and in part pointed out hereinafter.

In the accompanying drawings, in which several of various possible embodiments of the invention are illustrated, FIG. 1 is an enlarged longitudinal section of a multi-element infra-red sensor made in accordance with this invention;

FIGS. 2 and 3 are transverse sections on lines 2—2 and 3—3, respectively, of FIG. 1;

Figure 10:
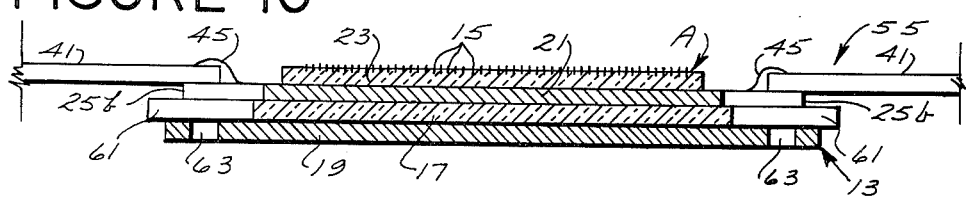
Figure 6:
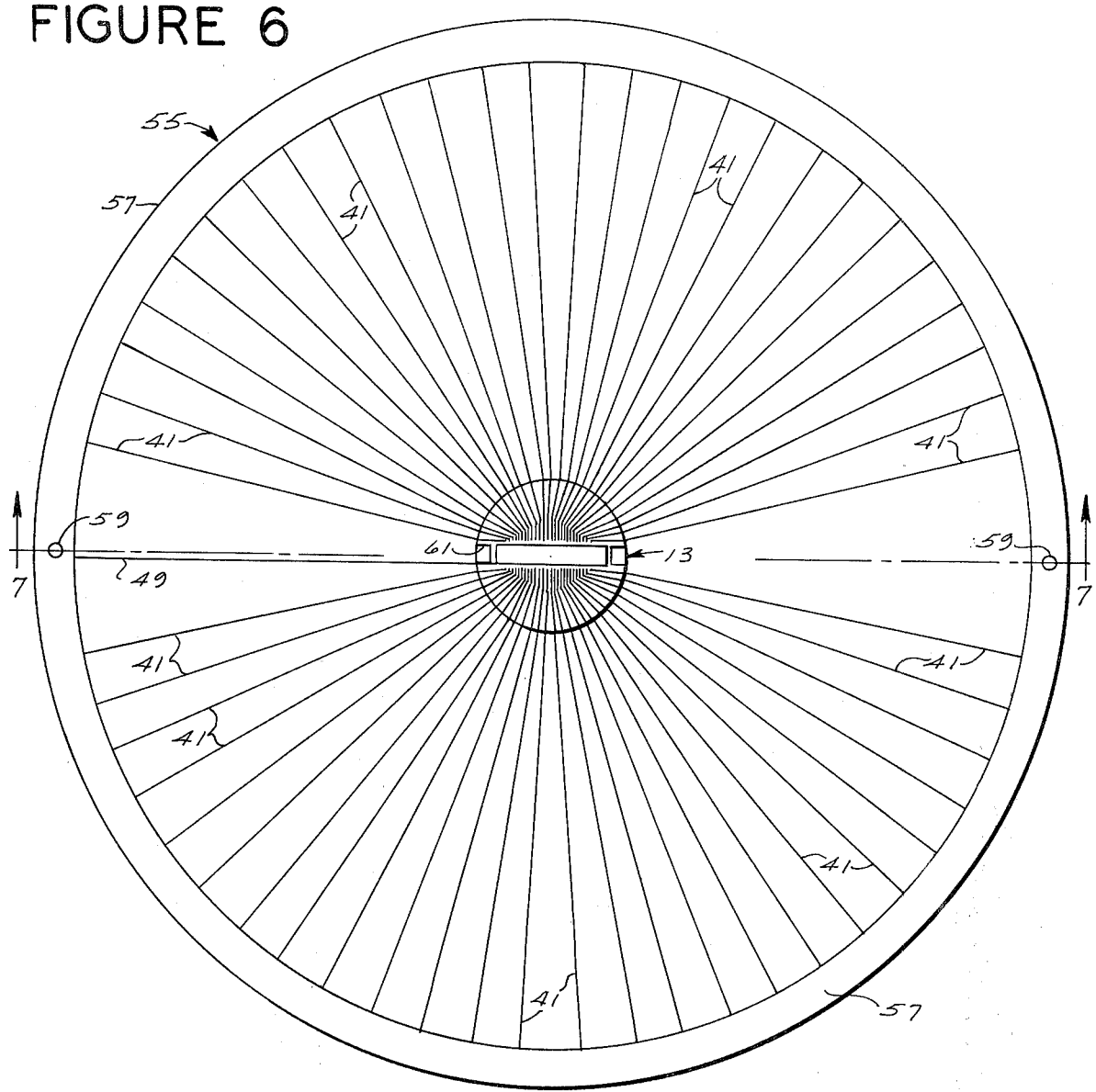
FIG. 6 is a plan view illustrating a sub-assembly of a printed circuit member and a lead frame made in the course of the manufacture of a multi-element infra-red sensor in accordance with this invention.
Figure 7:
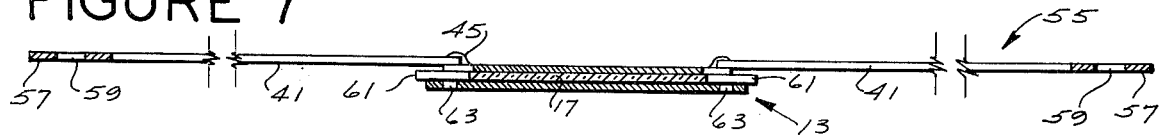
FIG. 7 is an enlarged section, partly broken away, on line 7—7 of FIG. 6.
Figure 11:
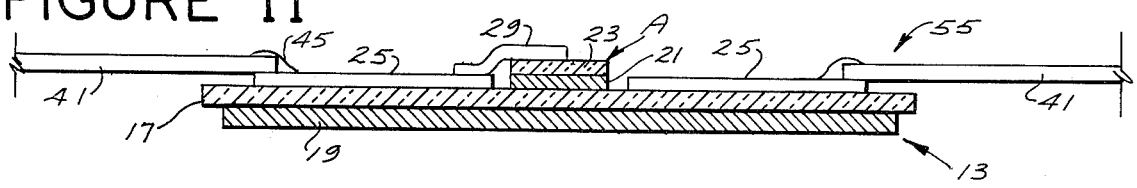
Figure 8:
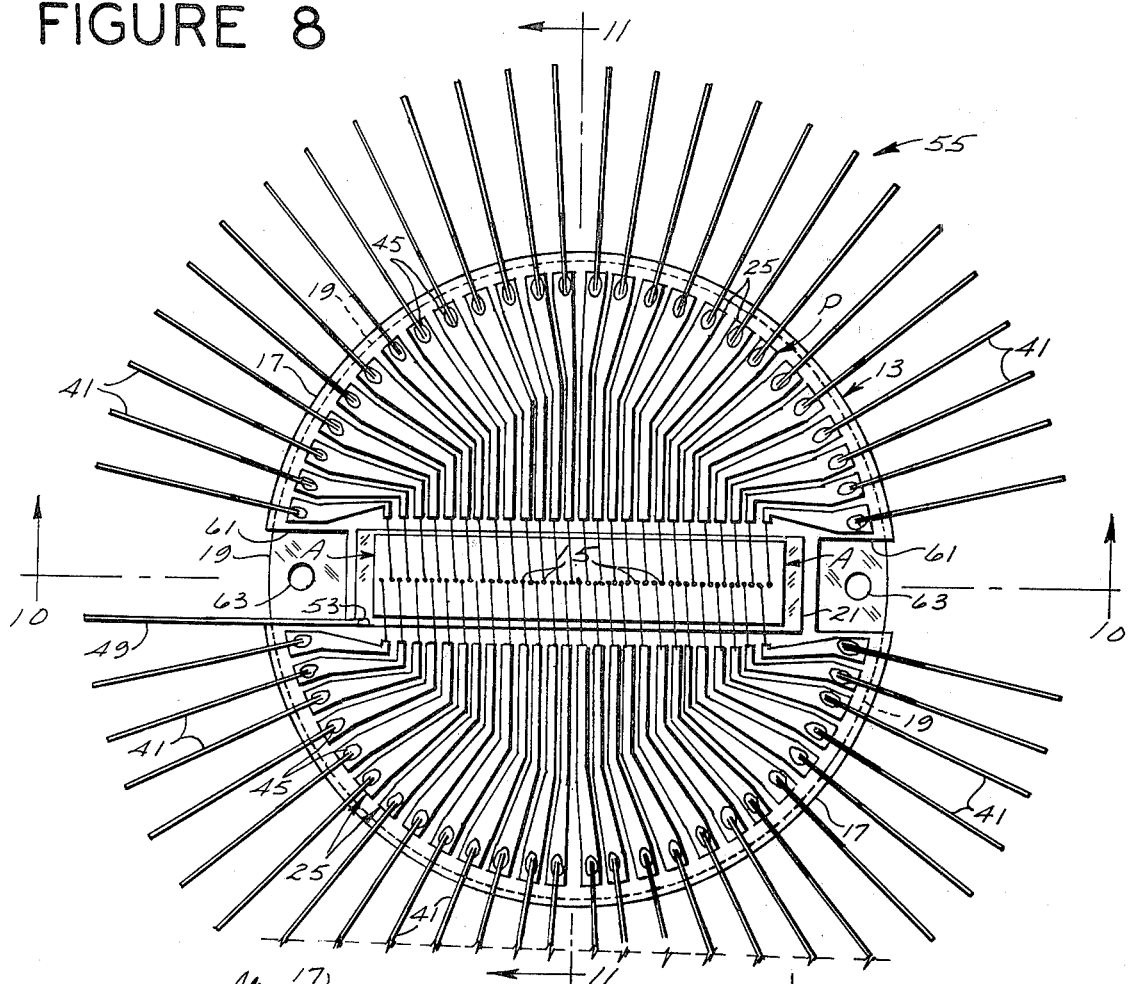
FIG. 8 is an enlarged view of the central portion of FIG. 7.

FIGS. 10 and 11 are sections on lines 10—10 and 11—11, respectively, of FIG. 8;

FIG. 12 is a perspective, with parts broken away and shown in section, illustrating a modification; and FIGS. 13 and 14 are enlarged fragments of FIG. 12.

Corresponding reference characters indicate corresponding parts throughout the several views of the drawings.

Thicknesses of certain parts are exaggerated in certain figures of the drawings.

Figure 1:
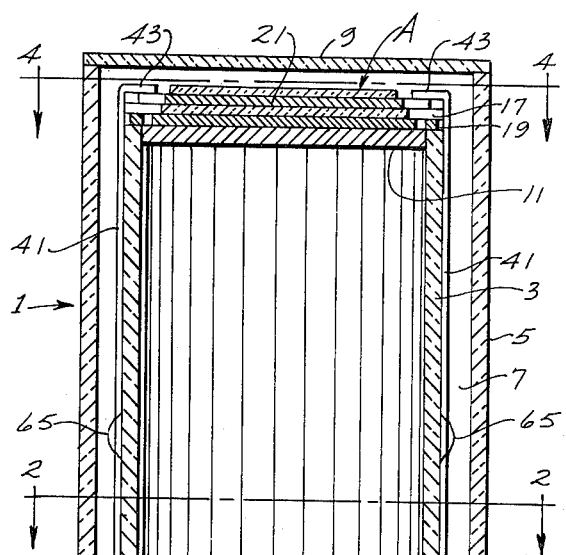
Figure 2:
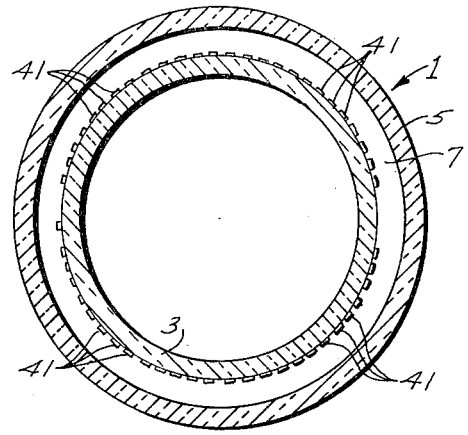
Figure 3:
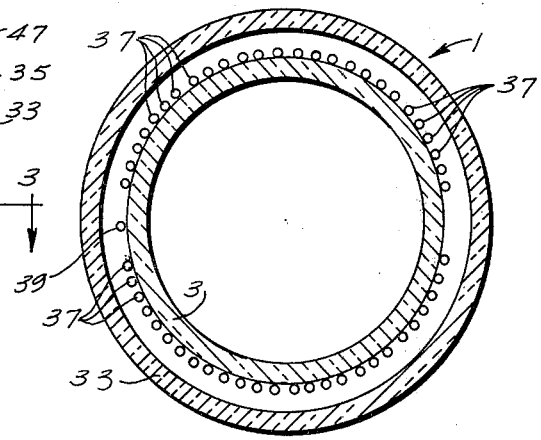
Figure 4:
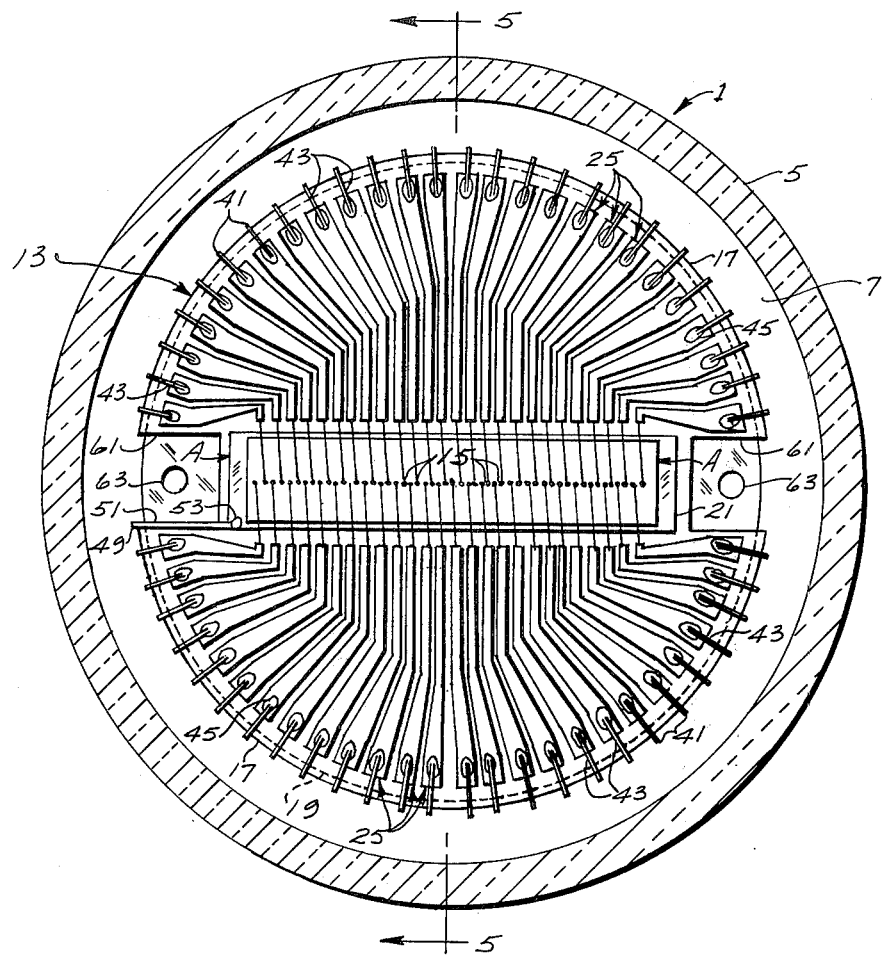
FIG. 4 is a further enlarged transverse section on line 4—4 of FIG. 1.
Figure 5:
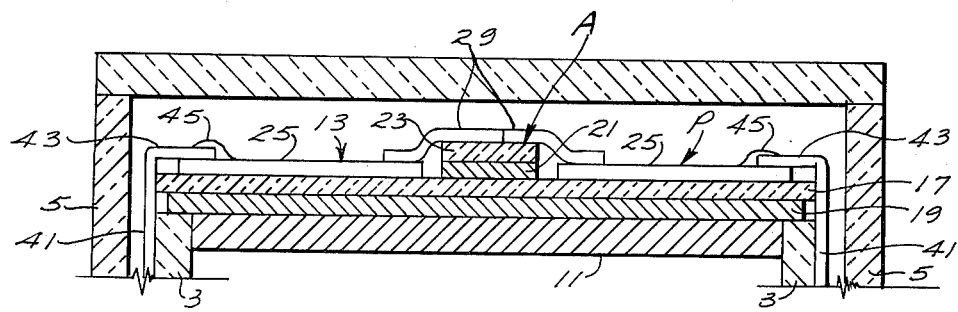
FIG. 5 is a fragmentary section on line 5—5 of FIG. 4.

Referring to the drawings, first more particularly to FIGS. 1–5, a multi-element infra-red sensor made in accordance with this invention is shown to comprise a vacuum receptacle, designated in its entirety by the reference numeral 1, having a tubular core 3 and a jacket 5 surrounding the core with a space 7 therebetween. This space is evacuated to constitute the receptacle as a vacuum receptacle or so-called Dewar tube. The core is generally cylindric, as is the jacket. The core 3 is open at one end (its lower end as shown in FIG. 1) and is closed at its other end (its upper end as shown). The jacket extends beyond the closed end of the core (i.e., its upper end) and has an infra-red transmitting window 9 at its upper end beyond the closed end of the core. Both the core and jacket, as herein illustrated, are made of glass, and the window 9 may be of any suitable infra-red transmitting material, such as sapphire, germanium or a special infra-red transmitting glass such as that sold under the trade name IRTRAN by Eastman Kodak Company. The top of the tubular core 3 is shown as sealed by a metallic plug 11 preferably made of a glass sealing alloy such as the iron-cobalt-nickel alloy sold under the trademark "Kovar", which may consist, for example, of 29% nickel, 17% cobalt and the balance iron.

Figure 9:
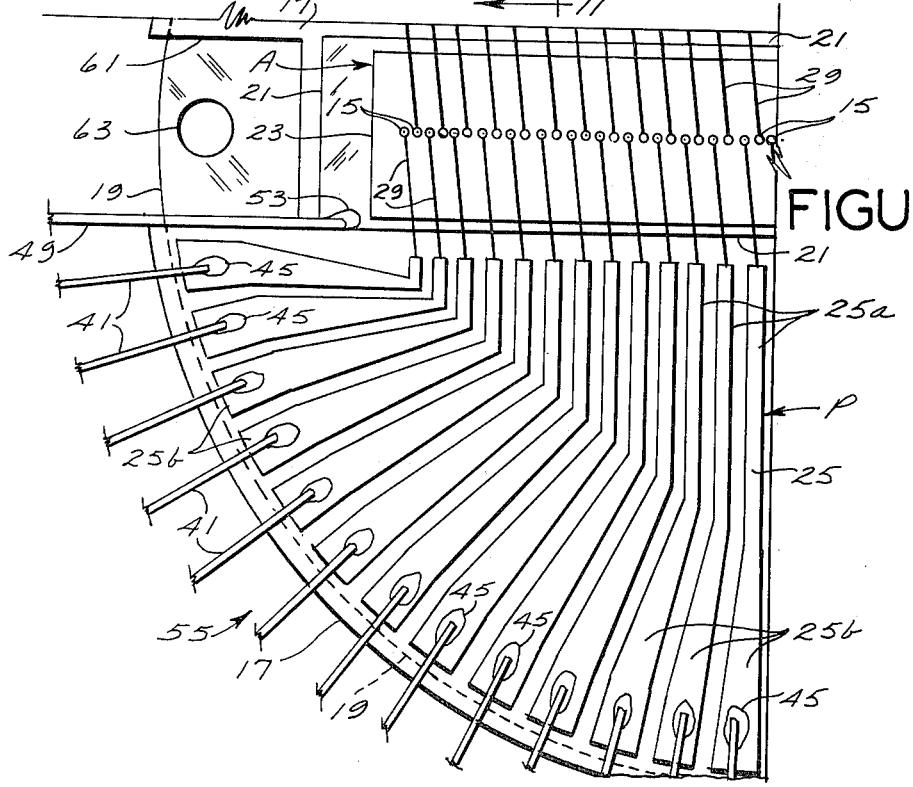
FIG. 9 is a further enlarged fragment of FIG. 8.

A printed circuit member designated in its entirety by the reference numeral 13 is mounted on the top of the core 3 (i.e., on the plug 11 of the core). An array of infra-red sensing elements designated in its entirety by the reference character A is mounted on the printed circuit member, this array comprising a plurality of infra-red sensing elements indicated at 15 (see FIGS. 4, 8 and 9) adapted for exposure to infra-red radiation transmitted through the window 9. Means is provided for connecting each sensing element in an electrical circuit with terminals on the outside of the receptacle, comprising a pattern P of leads (to be more particularly described) on the face of member 13 toward the window radiating out toward the margin of the member 13 from the sensing elements with their outer ends spaced at intervals around the margin, and leads extending longitudinally of the core spaced at intervals around the core interconnected with the outer ends of the radiating leads.

The printed circuit member is constituted by a disk 17 of electrical insulation material on a metal backing disk 19. The disk 17 is preferably made of ceramic, such as alumina, and is bonded in any suitable manner (as by adhesive) to the metal backing disk 19. The latter is preferably made of "Kovar" or other suitable glass sealing alloy, matching the plug 11. The pattern P is printed on the exposed face (i.e., the upper face) of the ceramic disk 17, by a suitable conventional printed circuit forming technique, such as a silk screening or etching technique. It comprises a generally central common lead 21, printed as a narrow strip extending diametrically across the ceramic disk. The multi-element array A is mounted on this common lead.

The array A comprises a semiconductor substrate or base 23 formed as a narrow strip having a width corresponding to that of the common lead strip 21 and a length somewhat shorter than that of the latter, the sensing elements 15 being constituted by regions or dots in one face of this substrate which have been doped to be sensitive to infra-red radiations. The substrate or base may be made of various suitable semiconductor materials, such as n-type silicon or indium arsenide semiconductor materials, and the sensing elements 15 formed in the substrate or base as p-type regions by diffusing suitable materials, such as phosphorus or cadmium into the substrate or base at desired points on the latter, employing a suitable known diffusion technique. For example, the base may be n-type silicon with elements 15 formed by diffusing phosphorus into the silicon, or n-type indium arsenide with elements 15 formed by diffusing cadmium into the indium arsenide. In each such case, sensing elements 15 are photovoltaic. However, it will be understood that it is within the purview of the invention to use photoconductive sensing elements. The sensing elements 15, as herein illustrated, are arranged in a row extending longitudinally of the strip-type substrate 23, and 52 such elements are shown by way of example.

The semiconductor substrate or base 23 is suitably secured on the common lead strip 21 with an ohmic connection therebetween so that strip 21 may serve as a common lead for all the sensing elements. This may be effected, for example, simply by soldering the base 23 to the strip 21, or by using an electrically conductive adhesive (e.g., an epoxy adhesive). As above noted, the base 23 is shorter than the strip 21, and it is mounted on strip 21 so that the ends of the latter are exposed beyond the ends of the base.

The radiating leads of the printed pattern P on the ceramic disk 19 are designated 25, there being one such radiating lead 25 for each sensing element 15. With 52 sensing elements, as herein illustrated, there are 52 such radiating printed leads on the disk 19. One half (26) of the leads 25 are on one side and the other half (26) of the leads 25 are on the other side of the common lead strip 21. The inner end of each lead 25 is located closely adjacent but spaced from the respective side of strip 21, and adjacent its respective sensing element. Each lead 25 has a relatively narrow inner portion 25a which extends out generally at right angles to the strip 21 on the respective side of the strip, and a generally sector-shaped narrow outer end portion 25b. Portions 25b of the leads 25 angle out toward the margin 27 of the ceramic disk. Thus, the leads 25 are in effect fanned out so that their outer ends are spaced at intervals around said margin. Each sensing element 15 is electrically interconnected with the inner end of its respective printed lead 25 on disk 25 via a wire 29 extending over the semiconductor base 23, successive wires 29 extending toward opposite sides of the base 23 for connection to the inner ends of leads 25 on opposite sides of the base.

The tubular core 3 of the vacuum receptacle 1 is shown as having an outwardly extending rim 31 at its lower end and a cuff 33 extending up from this rim, the lower end of the jacket 5 being sealed at 35 to the upper end of the cuff. Extending through the rim 31, spaced at intervals therearound corresponding to the spacing of the outer ends of the radiating printed leads 25, are electrically conductive terminal pins 37, one for each lead 25 and hence 52 in all. Also extending through the rim 35, generally in the vertical plane of the common lead strip 21, is a terminal pin 39, which constitutes a terminal pin common to all the sensing elements. The latter is located at one end of one of the two arrays of radiating leads 25. The pins 37 and the pin 39 (which may be referred to as feed-through pins) extend longitudinally on the outside of the core between the core and the cuff, having their upper ends generally at the level of the top of the cuff, and they extend out of the lower end of the receptacle to constitute prongs for socket-mounting of the device, or terminals for other modes of attachment of the device in a circuit network.

The outer ends of the printed leads 25 are interconnected with the pins 35 by conductors or leads 41 extending longitudinally on the outside of the core spaced at intervals around the core corresponding to the spacing of the outer ends of leads 25 (and the spacing of pins 35). These conductors or leads 41 have upper end portions 43 bent around the peripheral edge of the printed circuit member 13 overlying the outer ends of the radiating leads 25, and attached to the latter as by brazing, as indicated at 45. The conductors or leads 41 (of which there are fifty-two, one for each of the 52 sensing elements) extend longitudinally of the core on the outside thereof between the core and the jacket, and have their lower ends attached to the upper ends of the pins 35 as by soldering or welding, as indicated at 47. The common lead strip 21 is interconnected with the pin 39 by a conductor or lead 49 extending longitudinally of the core having an upper end portion 51 bent around the peripheral edge of member 13 overlying one end of strip 21 and attached to the latter as by brazing, as indicated at 53, and having its lower end attached to the upper end of pin 39 as by soldering or welding similarly to that indicated at 47.

The invention includes a special mode of assembly of the conductors 41 and 49 with the printed circuit member 13 and the core 3 of the vacuum receptacle 1, involving the prefabrication of what is referred to as a conductor or lead frame illustrated in FIGS. 6–11 and designated in its entirety by the reference numeral 55. This frame 55, as shown, comprises a thin flat circular rim or ring 57 from which the conductors or leads 41 and 49 radiate inward toward but terminate short of the center of the ring. The conductors or leads 41 are formed integrally with the ring, extending generally radially inward from the ring, spaced at intervals around the ring corresponding to the spacing of the outer ends of leads 25 around the margin of the ceramic disk 19, and the conductor or lead 49 extends generally radially inward from the ring at the end of one of the two arrays of conductors 41. The inner ends of the conductors or leads 41 are located around a circle having a diameter somewhat less than the diameter of the ceramic disk 49, and the length of conductors or leads 41 (i.e., the distance from the inner end of a conductor or lead 41 to its juncture with ring 57) is at least equal to and may be somewhat greater than the length required therefor in the sensor 1. The frame 55, which is preferably made of "Kovar" or other suitable electrically conductive glass sealing material, may be made, for example, by etching of a blank of thin sheet "Kovar", utilizing conventional photo-etching technique.

In the manufacture of a multi-element sensor 1 in accordance with this invention, a sub-assembly is made of the conductor or lead frame 55 and the printed circuit member 13, prior to mounting of the multi-element array A on the latter. This involves positioning the inner ends of conductors 41 of the frame 55 over the outer end portions 25b of the printed leads 25 on ceramic disk 17 of member 13, and the inner end of conductor 49 over one end of the common lead strip 21 on the ceramic disk. The ring 57 is shown as provided with holes 59. The ceramic disk is shown as having notches 61 at the ends of strip 21, and the backing disk 19 is shown as having holes 63 at these notches. These holes 59 and 63 serve to receive positioning pins (not shown) of a jig (not shown) for holding the member 13 and the lead frame 55 in appropriate registration, with the inner ends of conductors 41 and 49 properly located in respect to the outer ends of leads 25b and the strip 21. Suitable brazing compound is applied to the inner ends of the conductors and the subassembly is then heated to effect the brazing of the conductor ends to the leads 25b and strip 21. The function of the rim or ring 57 is to hold the conductors 41 and 49 in position for the manufacture of this sub-assembly. After the completion of the brazing operation, the ring is no longer needed, and it is cut off from the conductors 41 and 49.

Following the brazing operation, the multi-element array A is mounted on strip 21 on the ceramic disk 17, and the wires 29 attached to sensing elements 15 and printed leads 25. Attachment of wires 29 may be effected by conventional thermal compression, ball bonding or ultrasonic bonding techniques. The resultant subassembly of the completed member 13 and the conductors 41 and 49 may be then tested to determine whether it meets specifications, before committing it to further assembly with the core 3 of a vacuum receptacle.

If tested out satisfactorily, the sub-assembly of the member 13 and the conductors 41 and 49 radiating outward therefrom is then mounted on the head 11 of the core 3. This may be carried out by soldering the metallic backing 19 of member 13 to the head, or bonding it in place using a suitable epoxy adhesive, or by using screws, if desired, through the holes 63 in the backing disk 19. The conductors 41 and 49 are then bent down around the peripheral edge of member 13 to extend longitudinally of the core 3 on the outside of the latter, their lower ends being registered with the upper ends of pins 37 and 39, and attached to the latter as at 47. The conductors 41 and 49 may also be tacked to the outside of the core as indicated at 65 at some point between the member 13 and the pins to reduce microphonics. This tacking may be by suitable adhering of the conductors to the core (e.g., by an epoxy adhesive) or by fusing the conductors to the core. Then, the jacket 5 is applied and sealed at 35 to the cuff. The space 7 is evacuated via a suitable hole (not shown) in the receptacle, and the receptacle baked out to eliminate or reduce adsorbed gas molecules, and then the evacuation hole is sealed.

The above-described construction and mode of fabrication, utilizing the printed circuit member 13 and lead frame 55, are in sharp contrast to what may be regarded as a possible alternative involving the stringing of fine wires (e.g., platinum wires) from the sensing elements 15 over the top of the core and down the core and the soldering of such wires to the sensing elements 15 and the pins 37 and 39. Such soldering operations would be very difficult, as contrasted with the above-described brazing of conductors 41 and 49 to the printed leads 25 and the soldering of these conductors to the pins 37 and 39. The above-described construction and mode of fabrication are also in sharp contrast to another possible alternative involving painting of silver lead lines on the core and connection of wires to these lines and the sensing elements and connection of these lines to the pins, which would also involve difficult soldering operations. Moreover, the invention desirably enables use of "Kovar" or the like for the conductors 41 and 49, as distinguished from use of platinum wires or silver lead lines, and "Kovar" has a much lower thermal conductivity than either platinum or silver, thus reducing heat loss from the vacuum receptacle. Also, the above-described construction and mode of fabrication enable a thorough testing of the array A and the associated leads before installation in the vacuum receptacle.

As above-described, the conductors 41 and 49 are attached to feed-through pins 37 and 39 at the lower end of the receptacle 1. It is contemplated that these pins may be eliminated and that the conductors 41 and 49 themselves extend out of the lower end of the receptacle so that the lower ends of the conductors constitute the terminals for the sensing elements.

A further modification is shown in FIG. 12, with omission of a considerable number of connections for clarity of the drawing. In this modification, the core 3 is made with a pattern of leads 67 extending longitudinally on the outside of the core from its upper end to its lower end spaced at intervals around the core. These leads 67 may be provided either by applying a pre-etched lead frame pattern to the core and fusing the leads 67 of the pattern to the core, or by coating the core with an electrically conductive material (e.g., silver) and photo-etching it to form the leads 67, which appear as lines extending longitudinally on the core. A printed circuit member 13 is mounted on the closed end of the core, as in the FIG. 1 embodiment, and the outer ends of the printed leads 25 on member 13 are aligned with the lead lines 67 and interconnected with the lead lines 67 by conductors or leads 41a. The latter extend longitudinally on the outside of the core spaced at intervals around the core corresponding to the spacing of the lead lines. They have upper end portions 43a bent around the peripheral edge of the printed circuit member 13 overlying the outer ends of the radiating leads 25 and attached to the latter by brazing as indicated at 45a (see FIG. 13), and have their lower ends attached to the lead lines 67 as by soldering or welding, as indicated at 47a. These conductors or leads 41a correspond to the conductors or leads 41 and may be assembled with the printed circuit member 13 as part of a lead frame and applied to the core in the same manner as conductors 41.

The core 3 shown in FIG. 12 is formed with an outwardly extending flange 69 at its lower end having an upwardly directed rim 71. Prior to application of the jacket 5 to the core, a circuit board 73 is applied to the core surrounding the core on top of the rim 71 and sealed to the latter. The board 73 is made for example ceramic material, and has a center hole 75 receiving the core, and a pattern of leads 77 on its upper face radiating out from this hole. These leads initially have inner end portions 77a which project inward beyond the edge of the board around the center hole 75. When the core is inserted in the hole, these inner end portions 77a of leads 77 bend up on the core. They are registered with the lower end portions of longitudinal lead lines 67 on the core and attached thereto as by soldering. The leads 77 may be formed by use of a lead frame resembling the above-described lead frame 55 suitably bonded to the board 73, or may be constituted by wires suitably secured to the board.

After the board 73 has been assembled with the core 3, a ring 79 is applied to the top of the board surrounding the core and sealed to the board. The jacket 5 has an outwardly extending flange 81 at its lower end which is sealed to the ring 71 as indicated at 83 to complete the assembly.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. A multi-element infra-red sensor comprising a glass Dewar tube having a tubular glass core open at one end and closed by a metallic plug at the other and a jacket surrounding the core with a space therebetween, said space being evacuated, the jacket extending beyond the closed end of the core and having an infra-red transmitting window at its end beyond the closed end of the core, a printed circuit member on the closed end of the core, said member having a face toward said window and a pattern of electrically conductive leads printed on its said face including a generally central common lead, an array of infra-red sensing elements on said common lead in ohmic connection therewith, said pattern further comprising a plurality of printed leads, one for each sensing element, radiating out toward the margin of said member from points adjacent but spaced from said common lead and having their outer ends spaced at intervals around said margin, electrical interconnections between said sensing elements and the inner ends of said radiating printed leads, and means extending longitudinally of the core from the outer ends of said radiating printed leads and from said common lead for interconnecting each sensing element in an electrical circuit with terminals on the outside of the Dewar tube.

2. A multi-element infra-red sensor as set forth in claim 1 wherein said means comprises conductors extending longitudinally of the core spaced at intervals therearound having end portions bent around the peripheral edge of said member overlying the outer ends of said radiating printed leads and attached thereto and a conductor extending longitudinally of the core having an end portion bent around the peripheral edge of said member overlying and attached to said common lead.

3. A multi-element infra-red sensor as set forth in claim 2 wherein said conductors are formed of material having a relatively low thermal conductivity.

4. A multi-element infra-red sensor as set forth in claim 2 wherein the Dewar tube has electrically conductive terminal pins extending through its end opposite the window spaced at intervals around said end and wherein said conductors are attached to said pins within said Dewar tube.

5. A multi-element infra-red sensor as set forth in claim 4 wherein said conductors and pins are formed of material having a relatively low thermal conductivity.

6. A multi-element infra-red sensor as set forth in claim 4 wherein said conductors are secured directly to the core intermediate the pins and the closed end of the core to reduce microphonics.

7. A multi-element infra-red sensor as set forth in claim 1 wherein said means comprises conductive lines plated on the core spaced at intervals therearound and conductors extending longitudinally of the core spaced at intervals therearound having end portions bent around the peripheral edge of said member overlying the outer ends of said radiating printed leads and said common lead and attached thereto and to said lines.

8. A multi-element infra-red sensor as set forth in claim 7 wherein said Dewar tube has a circuit board at its end opposite the window having leads radiating out from the Dewar tube and wherein said lines are interconnected with the latter leads.

9. A multi-element infra-red sensor as set forth in claim 1 wherein said printed circuit member comprises a ceramic disk having a metallic backing bonded to said plug, the pattern being printed on the face of the ceramic disk.

10. A multi-element infra-red sensor as set forth in claim 9 wherein said common lead is printed as a narrow strip extending diametrically across the ceramic disk, and said radiating printed leads fan out from opposite sides thereof.

11. A multi-element infra-red sensor as set forth in claim 10 wherein said array comprises a strip of semiconductor material mounted on said common lead strip, said sensing elements being formed in the exposed face of said semiconductor strip.

* * * * *